United States Patent
Qian et al.

(10) Patent No.: US 9,147,852 B2
(45) Date of Patent: Sep. 29, 2015

(54) AIR STABLE ORGANIC-INORGANIC NANOPARTICLES HYBRID SOLAR CELLS

(75) Inventors: Lei Qian, Gainesville, FL (US); Jihua Yang, Minneapolis, MN (US); Jiangeng Xue, Gainesville, FL (US); Paul H. Holloway, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 13/254,929

(22) PCT Filed: Mar. 5, 2010

(86) PCT No.: PCT/US2010/026320
§ 371 (c)(1),
(2), (4) Date: Sep. 6, 2011

(87) PCT Pub. No.: WO2010/102178
PCT Pub. Date: Sep. 10, 2010

(65) Prior Publication Data
US 2012/0000526 A1 Jan. 5, 2012

Related U.S. Application Data

(60) Provisional application No. 61/158,189, filed on Mar. 6, 2009.

(51) Int. Cl.
*H01L 31/0224* (2006.01)
*H01L 51/42* (2006.01)
*H01L 51/00* (2006.01)

(52) U.S. Cl.
CPC .......... *H01L 51/4233* (2013.01); *H01L 51/426* (2013.01); *H01L 51/4273* (2013.01); *H01L 51/0036* (2013.01); *H01L 51/0037* (2013.01); *H01L 2251/308* (2013.01); *Y02E 10/549* (2013.01)

(58) Field of Classification Search
CPC ...................... H01L 21/02606; H01L 31/1013; H01L 31/022483; B82Y 30/00; B82Y 10/00
See application file for complete search history.

(56) References Cited

U.S. PATENT DOCUMENTS

| | | | |
|---|---|---|---|
| 2006/0076050 A1* | 4/2006 | Williams et al. | 136/263 |
| 2006/0211272 A1 | 9/2006 | Lee et al. | |
| 2006/0292736 A1 | 12/2006 | Lee et al. | |
| 2007/0169816 A1 | 7/2007 | Lee et al. | |
| 2007/0221926 A1 | 9/2007 | Lee et al. | |

(Continued)

OTHER PUBLICATIONS

Pacholski et al, Self-Assembly of ZnO: From Nanodots to Nanorods, Angew. Chem. Int. Ed. 2002, 41, No. 7.*

(Continued)

*Primary Examiner* — Matthew Martin
(74) *Attorney, Agent, or Firm* — Saliwanchik, Lloyd & Eisenschenk

(57) ABSTRACT

A solar cell includes a low work function cathode, an active layer of an organic-inorganic nanoparticle composite, a ZnO nanoparticle layer situated between and physically contacting the cathode and active layers; and a transparent high work function anode that is a bilayer electrode. The inclusion of the ZnO nanoparticle layer results in a solar cell displaying a conversion efficiency increase and reduces the device degradation rate. Embodiments of the invention are directed to novel ZnO nanoparticles that are advantageous for use as the ZnO nanoparticle layers of the novel solar cells and a method to prepare the ZnO nanoparticles.

14 Claims, 10 Drawing Sheets

(56) References Cited

U.S. PATENT DOCUMENTS

| | | | |
|---|---|---|---|
| 2008/0041447 A1* | 2/2008 | Tseng et al. | 136/263 |
| 2008/0163927 A1 | 7/2008 | Sohn et al. | |
| 2008/0303432 A1* | 12/2008 | Shao et al. | 313/504 |
| 2009/0152664 A1* | 6/2009 | Klem et al. | 257/440 |
| 2009/0165861 A1* | 7/2009 | Yoshimoto et al. | 136/263 |
| 2009/0255586 A1* | 10/2009 | Kim et al. | 136/263 |
| 2010/0282309 A1* | 11/2010 | Pschirer et al. | 136/255 |
| 2010/0283005 A1* | 11/2010 | Pickett et al. | 252/301.6 S |
| 2011/0056543 A1* | 3/2011 | Ackermann et al. | 136/255 |

OTHER PUBLICATIONS

Beek, "Efficient Hybrid Solar Cells from Zinc Oxide Nanoparticles and a Conjugated Polymer", Advanced Materials, 2004.*

Krebs, F.C. "Air stable polymer photovoltaics based on a process free from vacuum steps and fullerenes" *Solar Energy Materials and Solar Cells*, 2008, 92:715-726.

Hau, S.K. et al. "Air-stable inverted flexible polymer solar cells using zinc oxide nanoparticles as an electron selective layer" *Appl. Phys. Lett.*, 2008, 92:253301-1 to 253301-3.

Lee, K. et al. "Air-Stable Polymer Electronic Devices" *Adv. Mater.*, 2007, 19:2445-2449.

Wang, X. et al. "Polymer-Encapsulated Gold-Nanoparticle Dimers: Facile Preparation and Catalytical Application in Guided Growth of Dimeric ZnO-Nanowires" *Nano Lett.*, 2008, 8(9):2643-2647.

Beek, W.J.E., et al., "Hybrid Zinc Oxide Conjugated Polymer Bulk Heterojunction Solar Cells," The Journal of Physical Chemistry B, 2005, pp. 9505-9516, vol. 109, No. 19.

Qian, L. et al., "Electroluminescence from light-emitting polymer/ZnO nanoparticle heterojunctions at sub-bandgap voltages," *Nano Today*, 2010, pp. 384-389, vol.5.

Sui, X., "The preparation and photoluminescense of polymer-ZnO nano-composite materials", Dissertation Apply for a Ph.D. Degree to the Changchun Institute of Optics, Fine Mechanics and Physics, Chinese Academy of Sciences, May 2006, pp. 1-99, The People's Republic of China.

Guo, H. et al., "Influence of Nano-sized ZnO's Different Preparation Methods on the Performance of DMC's Synthesis," *Shandong Chemical Industry*, 2007, pp. 1-7, vol. 36, No. 8.

* cited by examiner

*a)*

*b)*

AIR STABLE ORGANIC-INORGANIC NANOPARTICLES HYBRID SOLAR CELLS

This invention was made with government support under grant numbers W911NF-07-1-0545 and DE-FG36-08GO18020 awarded by the Army Research Office and the Department of Energy respectively. The government has certain rights to this invention.

CROSS-REFERENCE TO RELATED APPLICATIONS

This application is the U.S. national stage application of international Patent Application No. PCT/US2010/026320, filed Mar. 5, 2010, which claims the benefit of U.S. Provisional Application Ser. No. 61/158,189, filed Mar. 6, 2009, the disclosures of which are hereby incorporated by reference in their entireties, including any figures, tables and drawings.

BACKGROUND OF THE INVENTION

Organic and hybrid organic-inorganic nanoparticle solar cells are promising sources of low-cost, large area renewable energy due to their potential to be fabricated by simple coating and printing methods. In particular, CdSe/poly(3-hexylthiophene) (P3HT) based hybrid solar cells have demonstrated power conversion efficiency of about 2.8%. Despite their promise, hybrid organic/inorganic nanoparticles photovoltaic cells are not used in commercial devices. The primary barrier has been the propensity of the hybrid organic/inorganic nanoparticles solar cells to rapidly degrade in air. The mechanism of solar cell degradation is attributed to effects of oxygen and water in the active layers, as most semiconducting polymer materials degrade when exposed to humidity and/or oxygen. Additionally, photo-oxidation can be a serious problem with these materials.

The degradation of organic polymer based photovoltaic devices can be reduced to acceptable levels by sealing the components inside an impermeable package using glass and/or metal to prevent exposure to oxygen and water vapor. Attempts to create flexible packaging using hybrid multilayer barriers comprised of inorganic oxide layers separated by polymer layers with total thickness of 5-7 µm have displayed some promising results, but encapsulation methods that can reduce oxygen and moisture permeation, are expensive and typically result in increased device thickness and a loss of flexibility. To achieve flexibility and a sufficiently thin layer for printed plastic electronics, improved barrier materials are needed or a device with an inherently reduced sensitivity to moisture and oxygen is needed to enable large scale commercialization on plastic substrates.

For devices with a reduced sensitivity, Lee et al., *Adv. Mater.* 2007, 19, 2445 reports an ITO/PEDOT:PSS/Active-Layer/TiO$_x$ Amorphous layer/Al device, as shown in FIG. 1. The titanium oxide layer between the low work function aluminum cathode and active layer of a polymer solar cell can significantly improved the device durability. The ability of titania (TiO$_2$) to have substantial oxygen/water protecting and scavenging effects was established, and the effect originates from TiO$_2$'s ability to act as a photocatalysis and to an inherent oxygen deficiency of TiO$_2$. Typically, crystalline TiO$_2$ layers are prepared at temperatures above 450° C. which is inconsistent with a process for the fabrication of polymer electronic devices. Lee et al. developed a solution-based sol-gel process that allows fabrication of a titanium sub-oxide (TiO$_x$) layer on a polymer-based active layer as the collector and optical spacer for a polymeric solar cell. Unfortunately, the power conversion efficiency of the solar cell with a titanium sub-oxide (TiO$_x$) layer deceased by about 50% after 6 days in a glove box ambient.

Hau et al., *Appl. Phys. Lett.* 2008 92, 253301 reports an ITO/ZnO NPs/Active-Layer/PEDOT:PSS/Ag inverted device, as shown in FIG. 2, where ZnO NPs are ZnO nanoparticles. The ZnO NPs were used because of their good electron mobility without a thermal post-treatment. The ZnO nanoparticle layer on ITO/glass as well as ZnO NPs on ITO-coated plastic substrates were comparable in stability to those of conventional devices using LiF/Al as an electrode on glass substrate. An improved stability for the device is attributed to the PEDOT:PSS layer and Ag electrode, where the PEDOT:PSS layer acts as a barrier that prevents oxygen from entering the active layer and the ability of the Ag electrode to form a layer of silver oxide in air that increases its effective work function. The solar cells exhibited only a 20% loss of power conversion efficiency after 40 days in air. Unfortunately the cost of silver, or other less air sensitive high work function metals, such as gold, is prohibitively expensive to be substituted for Al electrodes.

Hence, there remains a need for a hybrid organic-inorganic nanoparticle solar cell that displays a good efficiency and stability at a viable price to allow commercialization.

BRIEF SUMMARY OF THE INVENTION

Embodiments of the invention are directed to air resistant photovoltaic cells where a low work function electrode and a photoactive layer comprising an organic polymer that exhibits semiconductor properties and absorbs visible or near infrared electromagnetic radiation have a ZnO nanoparticle layer situated between and electrically contacting at least a portion of the low work function electrode and the photoactive layer with a transparent high work function electrode that is a bilayer electrode physically and electrically contacting the photoactive layer. The low work function electrode can be aluminum or it can be magnesium, calcium or barium covered by aluminum. The organic polymer can be one with a multiplicity of repeating units that are substituted or unsubstituted thiophene, phenylene vinylene, phenylene ethynylene, fluorene or any combination thereof. The photoactive layer can further include inorganic nanoparticles in the form of an organic-inorganic nanoparticle composite such as a cadmium selenide nanoparticle poly(3-hexylthiophene) composite (CdSe/P3HT). Other inorganic nanoparticles that can be used include those of group-IV, II-VI, III-V, IV-VI, semiconductors or semiconductor alloys such as $Si_xGe_{1-x}$, $Zn_xCd_{1-x}Se_yTe_{1-y}$, PbS, PbSe, CdTe, $CdTe_ySe_{1-y}$, $Zn_xCd_{1-x}S_zTe_ySe_{1-y-z}$, $In_xGa_{1-x}As$ or $Cu(In_xGa_{1-x})Se_2$. The transparent high work function electrode can be poly(3,4-ethylenedioxylenethiophene)-polystyrene sulfonic acid (PEDOT:PSS) on indium-tin-oxide (ITO).

An embodiment of the invention is directed to coupled ZnO nanospheres and the synthesis of these ZnO nanoparticles where the individual spheres have a mean diameter of 3 to 4 nm. Nanoparticulate ZnO layers with an average surface roughness of about 3 nm can be prepared with these ZnO nanoparticles.

DETAILED DESCRIPTION OF THE INVENTION

Figure 1:
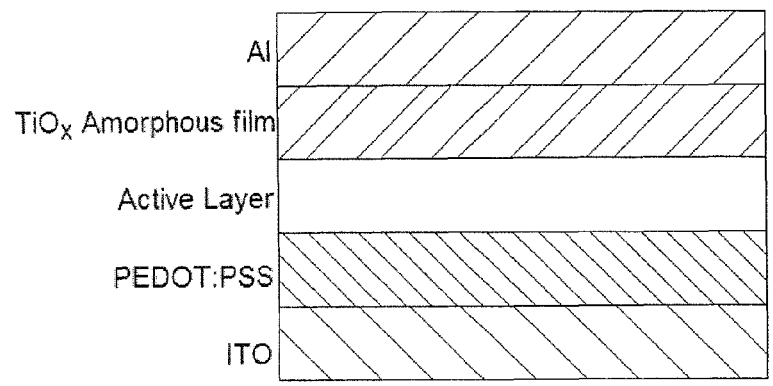
FIG. 1 shows a prior art ITO/PEDOT:PSS/Active-Layer/TiO$_x$ Amorphous layer/Al solar cell design.
Figure 2:
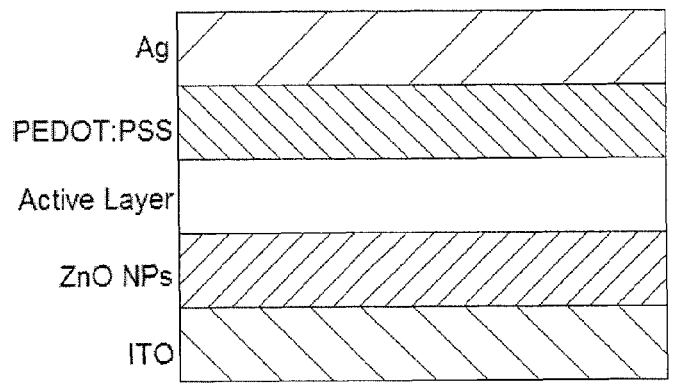
FIG. 2 shows a prior art ITO/ZnO NPs/Active-Layer/PEDOT:PSS/Ag inverted solar cell design.
Figure 3:
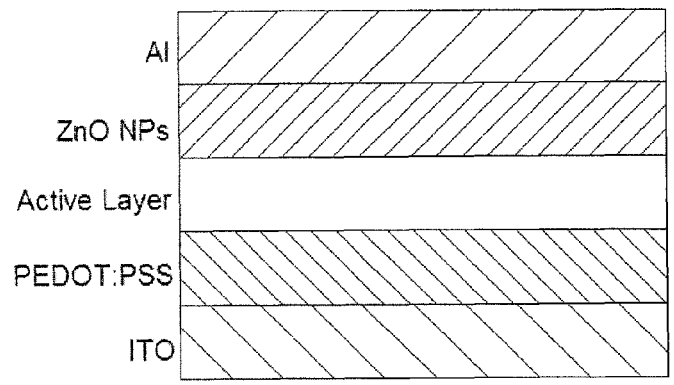
FIG. 3 shows an ITO/PEDOT:PSS/Active-Layer/ZnO NPs/Al solar cell design according to embodiments of the invention.

An ITO/PEDOT:PSS/Active-Layer/ZnO NPs/Al solar cell according to embodiments of the invention is shown in FIG. 3. The novel hybrid organic photovoltaic (solar) cell has an increased efficiency and stability due to the inclusion of a ZnO nanoparticle layer between an aluminum electrode and a photoactive layer (active layer). The active layer can be an organic layer or an organic-inorganic nanoparticle layer, for example a cadmium selenide nanoparticle poly(3-hexylthiophene) composite (CdSe/P3HT) according to an embodiment of the invention. The incorporation of inorganic nanoparticles can lead to improved collection of photogenerated charges due to the high charge carrier mobility of inorganic semiconductors than that of organic semiconductors. Other group-IV, II-VI, III-V, IV-VI, I-III-VI$_2$ semiconductors, as well as alloys of these semiconductors (such as $Si_xGe_{1-x}$, $Zn_xCd_{1-x}Se_yTe_{1-y}$, PbS, PbSe, CdTe, $CdTe_ySe_{1-y}$, $Zn_xCd_{1-x}S_zTe_ySe_{1-y-z}$, $In_xGa_{1-x}As$, or $Cu(In_nGa_{1-x})Se_2$) could also be used rather than CdSe, as the nanoparticles for use in the hybrid active layer. Examples of other organic polymers and copolymers that can be used includes those that comprise one or more substituted or unsubstituted repeating units such as thiophene, phenylene vinylene, phenylene ethynylene, fluorene, or other conjugated polymers that exhibit semiconducting properties and absorption in the visible and near infrared spectral regions. The active layer can be about 50 to about 300 nm in thickness to ensure sufficient absorption of incident light.

The ZnO nanoparticle layer is situated between the active layer and the low work function electrode and electrically contacts, generally physically contacting at least a portion of both the active layer and the electrode. In many embodiments of the invention the active layer is fully covered by the ZnO nanoparticle layer. The ZnO nanoparticle layer can have a thickness of 5 to about 50 nm and can be formed using any fluid process known in the art. For example, the ZnO nanoparticle layer can be formed on the surface of the active layer by spin coating or ink-jet printing from a 20 to 40 mg/ml nanoparticle in ethanol suspension.

The solar cell is a thin layer device, according to embodiments of the invention. Typically the device, as shown in FIG. 3, is formed on a transparent substrate such as glass or plastic, where the transparent high work function electrode is deposited on the substrate. The transparent high work function electrode is constructed for collecting hole carriers. This electrode can be a bilayer electrode comprising a hole injecting layer, such as, poly(3,4-ethylenedioxylenethiophene)-polystyrene sulfonic acid (PEDOT:PSS) on indium-tin-oxide (ITO). Other materials such as other conducting oxides and metallic polymers that are known in the art can be used for the transparent electrode rather than ITO, including indium-zinc-oxide (IZO), zinc-tin-oxide (ZTO), copper-indium-oxide (CIO), copper-zinc-oxide (CZO), gallium-zinc-oxide (GZO), aluminum-zinc-oxide (AZO), and carbon nanotube based films. The low work function metal counter electrode such as aluminum, or in other embodiments of the invention thin layers of magnesium, calcium, barium, LiF, CsF, or $Cs_2CO_3$ that is covered with aluminum collects electron carriers. The photoactive layer, for example the CdSe/P3HT layer is an absorbing and charge separating bulk heterojunction layer, which, as illustrated in FIG. 3, is situated between the two charge selective electrodes. The work function difference between the two electrodes provides a driving force for the photo-generated electrons and holes to migrate toward the opposing electrodes.

Figure 4:
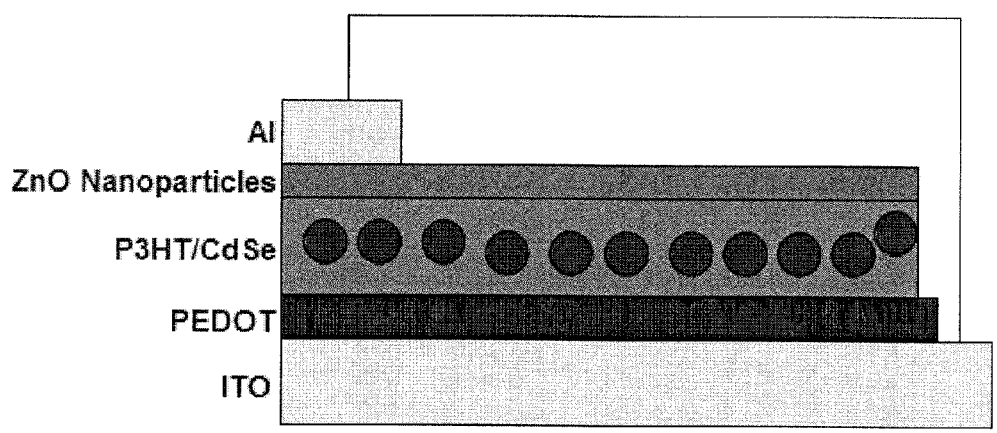
FIG. 4 shows an exemplary photovoltaic device according to an embodiment of the invention where the Active-Layer is P3HT/CdSe.
Figure 5:
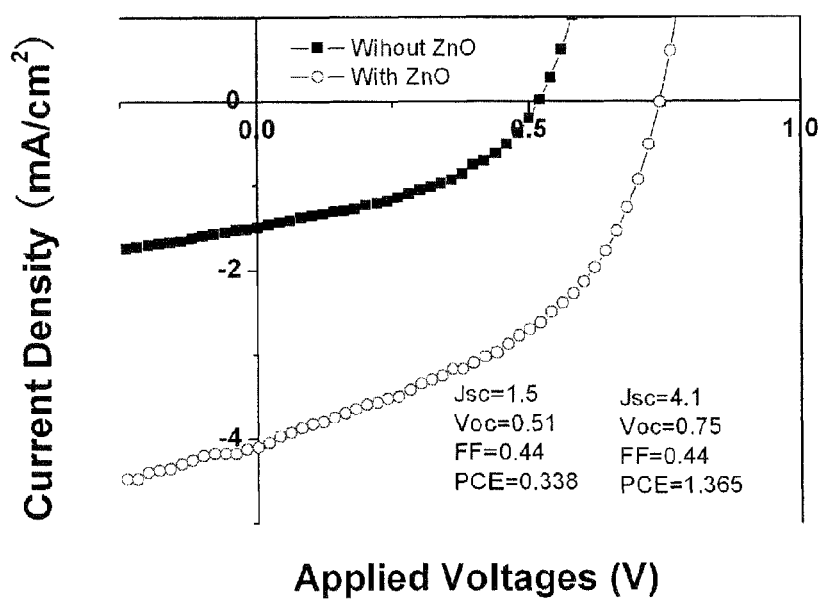
FIG. 5 is a plot of current density for an applied voltage for two solar cells of the design of FIG. 4 where one has and the other is free of the ZnO nanoparticle layer according to an embodiment of the invention, but are otherwise of equivalent structure.
Figure 6:
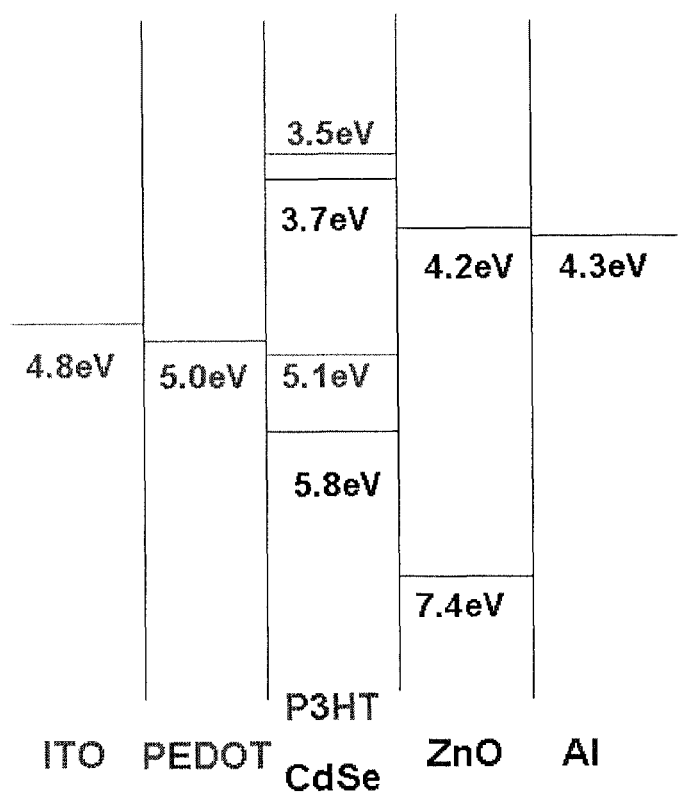
FIG. 6 shows an energy level diagram for the device of FIG. 4 according to an embodiment of the invention.
Figure 7:
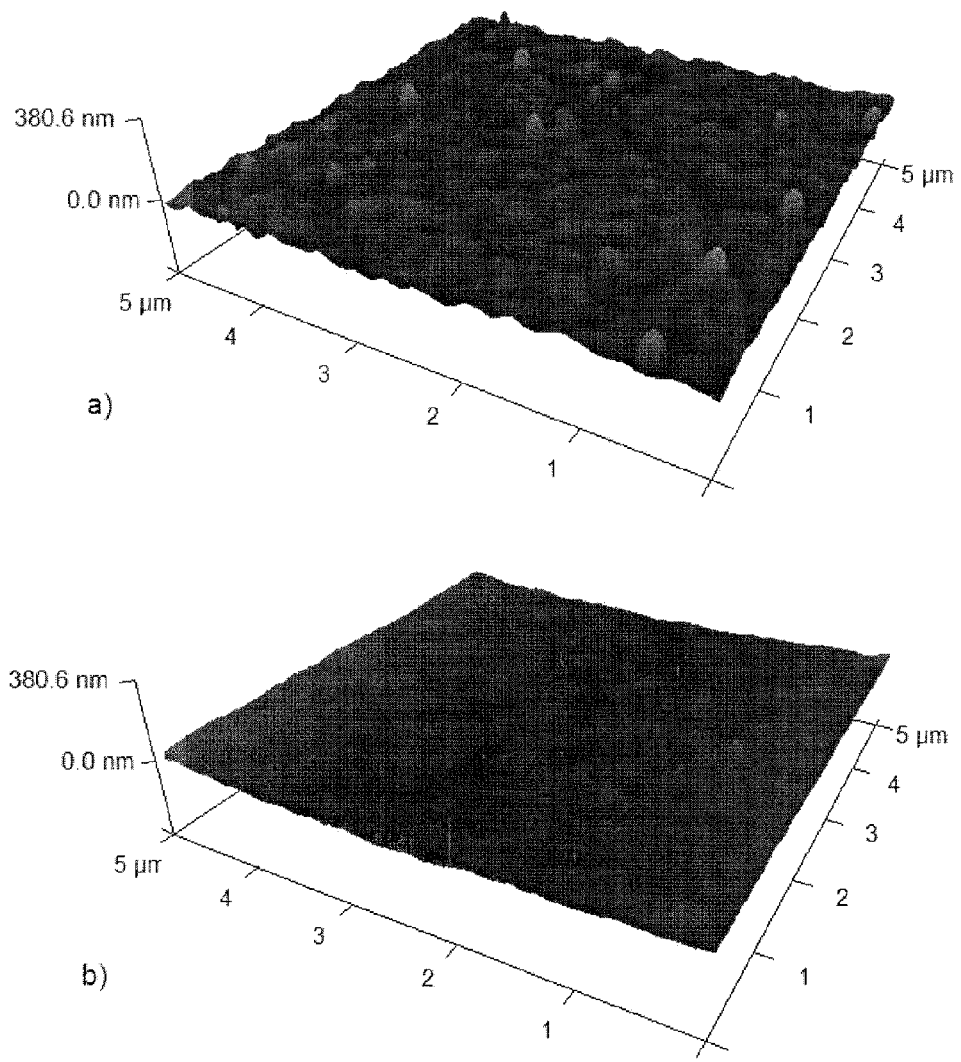
FIG. 7 shows atomic force microscopy (AFM) images of the surface of a) an ITO/PEDOT/CdSe:P3HT/Al device and b) an ITO/PEDOT/CdSe:P3HT/ZnO/Al device of FIG. 4 according to an embodiment of the invention.

Surprisingly, the inventors discovered that the inclusion of the ZnO nanoparticles layer between an Al electrode and the active layer not only promotes a power conversion efficiency increase, but also significantly reduces the device's degradation rate. The power conversion efficiency of a CdSe/P3HT-based hybrid solar cell, as illustrated in FIG. 4, increases by a factor of 2.5 when a ZnO nanoparticle layer is inserted between the active CdSe/P3HT layer and an aluminum electrode. The current density versus voltage of hybrid solar cells without and with a ZnO nanoparticle layer is shown in FIG. 5 for a non-optimized developmental solar cell. A four-fold power conversion efficiency increase to 1.4% was observed for a solar cell containing a ZnO nanoparticle layer from that of 0.34% for an otherwise equivalent solar cell lacking the ZnO nanoparticle layer. Although not to be bound by a mechanism, the improved efficiency may be due to lowering of the interfacial barrier to electron transfer afforded by the ZnO nanoparticle layer. An energy level diagram for the cell illustrated in FIG. 4 is shown in FIG. 6. By including the ZnO nanoparticle layer, the surface of the device is also observably smoother than an equivalent device lacking the ZnO nanoparticle layer, as shown in FIGS. 7a and 7b.

Figure 8:
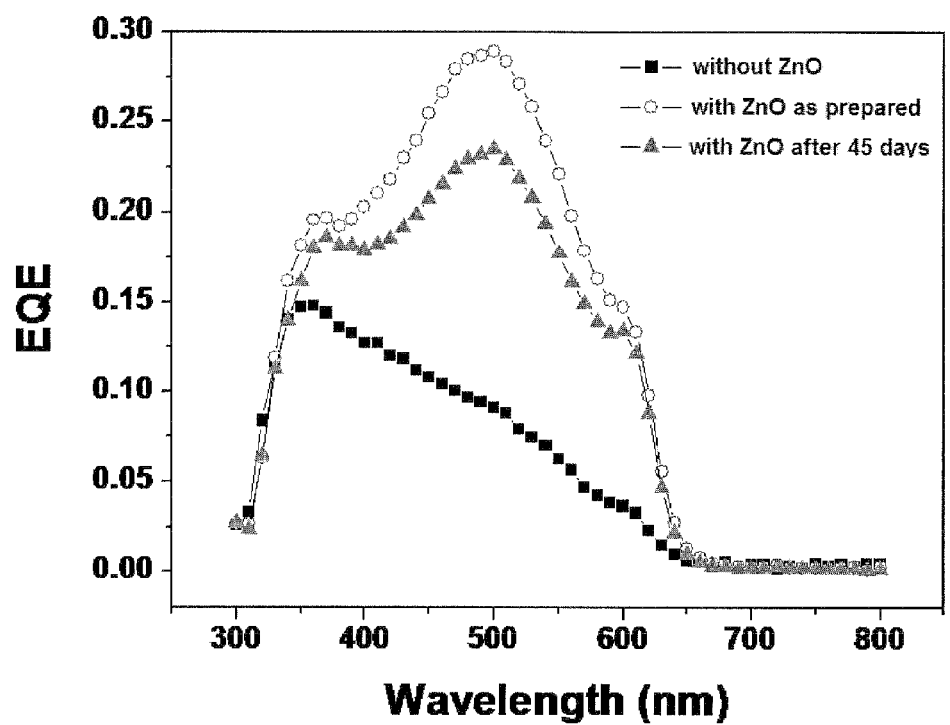
FIG. 8 is a composite plot of the external quantum efficiency (EQE) for the ITO/PEDOT/CdSe:P3HT/Al device of FIG. 7, and the ITO/PEDOT/CdSe:P3HT/ZnO/Al device according to the embodiment of the invention as prepared and after use for 45 days.

A reduced degradation rate also occurs for these hybrid solar cells with a ZnO nanoparticle layer as can be seen in FIG. 8 where the external quantum efficiency (EQE) is plotted against wavelength for fresh and aged solar cells relative to cell without a ZnO nanoparticle layer. Although not to be bound by a mechanism, the degradation resistance may result from absorption of UV and/or reduced diffusion of oxygen and water from air into the CdSe/P3HT layer, where they can react with the active layer, due to the ZnO nanoparticle layer. Again, the improved stability was observed without the use of an encapsulant. It is reasonable that the lifetime of ZnO-based hybrid solar cells could be further improved by encapsulation or other external package. This hybrid organic/inorganic nanoparticle solar cell device permits a reliable, efficient commercial product.

Figure 9:
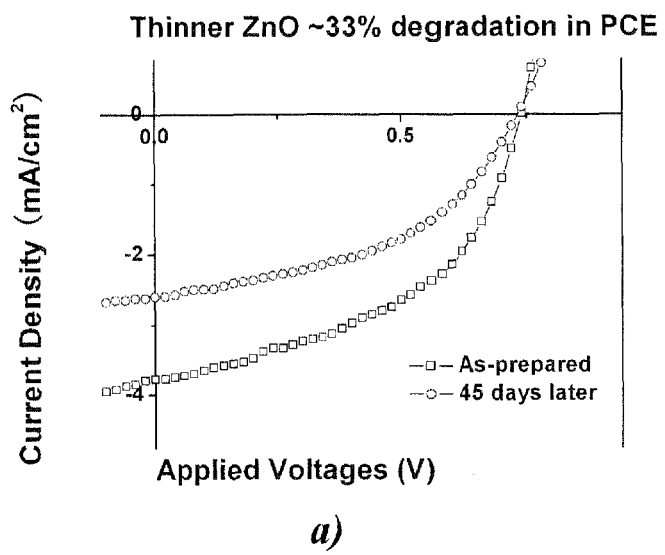
FIG. 9 are plots of current density for an applied voltage for two solar cells one with a) a relatively thin ZnO nanoparticle layer and b) a relatively thick ZnO nanoparticle layer as produced and after 45 days of use according to embodiments of the invention.
Figure 9:
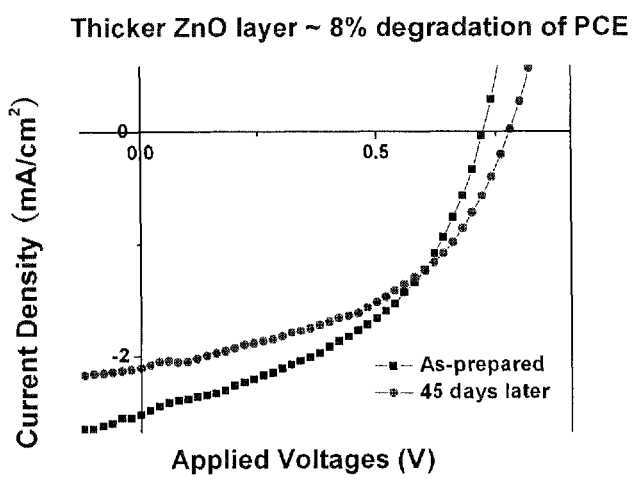
Figure 10:
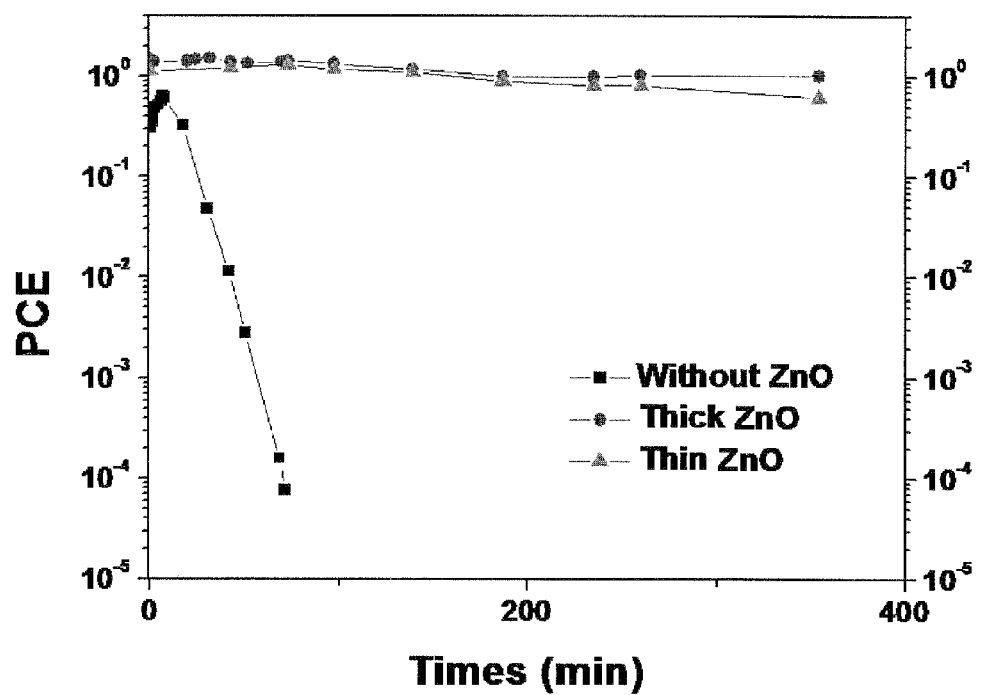
FIG. 10 is a composite plot of the power conversion efficiency (PCE) over a 6 hour period for the ITO/PEDOT/CdSe:P3HT/Al device of FIG. 7, and ITO/PEDOT/CdSe:P3HT/ZnO/Al devices with thin or thick ZnO layers according to the embodiment of the invention.

The degradation of this hybrid device was dramatically suppressed as can be seen in FIGS. 9a and 9b where the current density is plotted against voltage for cells having a thin and a thick ZnO nanoparticle layer. After 45 days in air, a solar cell with a thin ZnO nanoparticle layer retained 64% of its original power conversion efficiency, FIG. 9a. After 45 days in air, a solar cell with a thick ZnO nanoparticles layer resulted in retention of 84% of the power conversion efficiency, FIG. 9b. Both solar cells were used in the presence of ambient air with no encapsulation. A plot of the power conversion efficiency (PCE) of solar cells over time for cells having thin and thick ZnO nanoparticle layers relative to cell lacking a ZnO nanoparticle layer is shown in FIG. 10, which demonstrates the superior PCE of devices having ZnO nanoparticle layers according to an embodiment of the invention.

In an embodiment of the invention, the ZnO nanoparticles can be prepared by dissolving a zinc salt of a carboxylic acid, for example zinc acetate, in a polar aprotic solvent such as dimethylsulfoxide and combining the zinc salt solution with a solution of a tetraalkylammonium hydroxide in an alcohol, for example tetramethylammonium hydroxide in ethanol. Other polar aprotic solvents that can be used include, but are not limited to, dimethylformamide (DMF) and acetonitrile (MeCN). Other tetraalkylammonium hydroxide salts that can be used include, but are not limited to, tetraethylammonium hydroxide tetrabutylammonium hydroxide, other symmetric tetraalkylammonium hydroxides and asymmetric tetraalkylammonium hydroxides. Other alcohols that can be used include, but are not limited to, isopropanol and butanol. Typically, but not necessarily, the concentration of tetraalkylammonium hydroxide is in excess of the concentration of the zinc salt. After combination, ZnO nanoparticles form with a mean diameter of less than 6 nm, for example from 2 to 6 nm or 3 to 4 nm. Typically, but not necessarily, the solutions are combined with agitation. The solutions can be combined and maintained at normal room temperatures. After a desired period of time, for example one hour, ZnO nanoparticles are formed and can be isolated by appropriate techniques. For example excess reagents can be washed from the ZnO nanoparticles by a mixture of an alcohol and a hydrocarbon, for example a mixture of ethanol and heptane, where the ethanol-heptane ratio is, for example 1 to 4 parts by volume.

Figure 11:
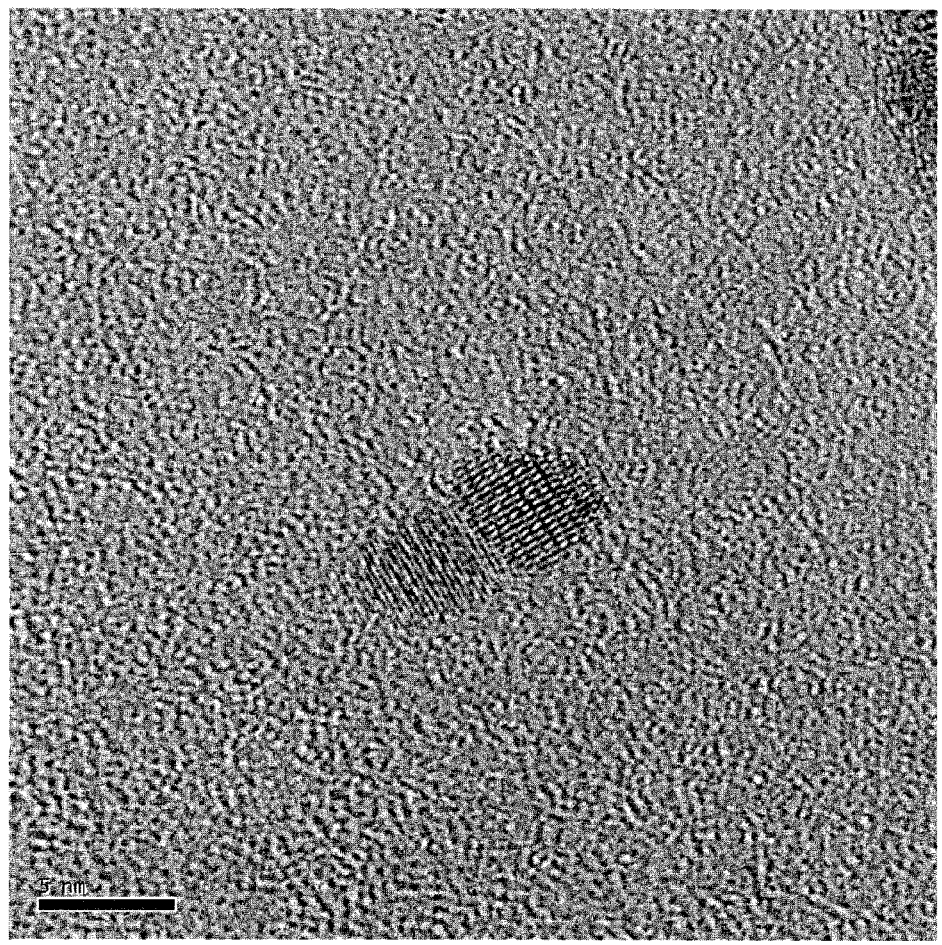
FIG. 11 is transmission electron microscope image with a 5 nm scale bar for a ZnO nanoparticle in the form of dimer coupled ZnO nanospheres according to an embodiment of the invention.
Figure 12:
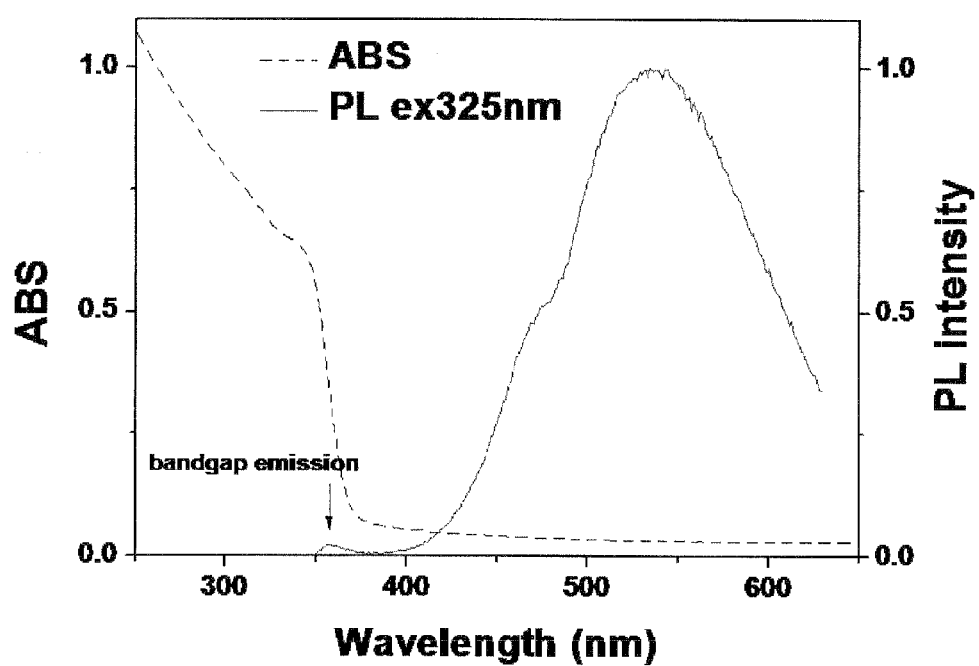
FIG. 12 is a composite plot of the Absorbance spectrum and the photoluminescence spectrum excited at 325 nm for a suspension of ZnO nanoparticles according to an embodiment of the invention.

By controlling the proportions of the tetraalkylammonium hydroxide and the zinc salt the resulting ZnO nanoparticles are in the form of isolated nanospheres or the nanospheres can be coupled as fused dimers, trimers, tetramers or even higher aggregated ZnO nanoparticles. Dimer coupled ZnO nanospheres are shown in FIG. 11. The highest quality ZnO nanoparticle layers with regard to the properties and stabilities of the photovoltaic cells have resulted from ZnO nanoparticles that have a high proportion of dimer coupled ZnO nanospheres. The optical properties of the ZnO nanospheres are illustrated in FIG. 12 where very little absorption is observed above a wavelength of 370 nm and photoluminescence by the absorption of near UV light emits in the visible range.

Materials and Methods

The ZnO nanoparticles with a typical mean diameter of 3-4 nm were synthesized using a sol-gel method. For a typical synthesis, zinc acetate in dimethyl sulfoxide (DMSO) (0.1M, 30 mL) and tetramethylammonium hydroxide in ethanol (0.55M, 30 mL) were mixed and stirred for one hour at room temperature, washed two times with ethanol:heptane (1:4 by volume) and stored in ethanol. After spin-coating onto the active layer, the thickness of the ZnO nanoparticle layer was from 5-50 nm, depending on the solution concentration and spin-speed. The average roughness ($R_a$) of the ZnO nanoparticle layer was about 3 nm.

The photovoltaic characteristics of the hybrid solar cells were measured using an Oriel Xe-arc lamp that provided simulated AM1.5 solar illumination. An Agilent 4155C semiconductor parameter analyzer was used to measure the current-density-voltage (J-V) characteristics of PV devices in the dark and under simulated AM 1.5 solar illumination. The light intensity was measured using a calibrated single-crystalline silicon reference cell with a KG1 filter, and the spectral mismatch factor was corrected according to the ASTM Standard E973.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An air resistant photovoltaic cell comprising:
   a low work function electrode;
   a photoactive layer comprising an organic polymer wherein said photoactive layer exhibits semiconductor properties and absorbs visible and/or near infrared electromagnetic radiation;
   a ZnO nanoparticle layer situated between said low work function electrode and said photoactive layer and physically contacting and electrically contacting at least a portion of said low work function electrode and physically contacting and electrically contacting at least a portion of said photoactive layer, wherein said ZnO nanoparticle layer comprises a multiplicity of coupled ZnO nanospheres, wherein individual monomer uncoupled ZnO nanospheres having a mean diameter of 3 to 4 nm are fused as dimer coupled ZnO nanospheres, trimer coupled ZnO nanospheres, tetramer coupled ZnO nanospheres, and pentamer coupled ZnO nanospheres, and wherein a majority of said coupled ZnO nanospheres are dimer coupled ZnO nanospheres; and
   a transparent high work function electrode comprising a bilayer electrode physically contacting and electrically contacting said photoactive layer.

2. The photovoltaic cell of claim 1, wherein said low work function electrode comprises aluminum.

3. The photovoltaic cell of claim 1, wherein said low work function electrode comprises a thin layer of magnesium, calcium, barium, LiF, CsF, or $Cs_2CO_3$ that is covered with aluminum.

4. The photovoltaic cell of claim 1, wherein said photoactive layer further comprises inorganic nanoparticles or an organic-inorganic nanoparticle composite.

5. The photovoltaic cell of claim 4, wherein said inorganic nanoparticles comprise group-IV, II-VI, III-V, IV-VI, I-III-$VI_2$ semiconductors or semiconductor alloys.

6. The photovoltaic cell of claim 1, wherein said organic polymer comprises a multiplicity of repeating units comprising substituted or unsubstituted thiophene, phenylene vinylene, phenylene ethynylene, fluorene or any combination thereof.

7. The photovoltaic cell of claim 1, wherein said transparent high work function electrode comprises poly(3,4-ethylenedioxylenethiophene)-polystyrene sulfonic acid (PEDOT:PSS) on indium-tin-oxide (ITO).

8. The photovoltaic cell of claim 1, wherein said transparent high work function electrode comprises indium-tin-oxide (ITO), indium-zinc-oxide (IZO), zinc-tin-oxide (ZTO), copper-indium-oxide (CIO), copper-zinc-oxide (CZO), gallium-zinc-oxide (GZO), aluminum-zinc-oxide (AZO), or carbon nanotubes.

9. The photovoltaic cell of claim 1, wherein said ZnO nanoparticle layer is 5 nm to 50 nm in thickness.

10. The photovoltaic cell of claim 1, wherein said ZnO nanoparticle layer has an average roughness of 3 nm.

11. The photovoltaic cell of claim 1, wherein said ZnO nanoparticle layer further comprises a blend with LiF, CsF, $Cs_2CO_3$, CsOH, or a second polymer.

12. The photovoltaic cell of claim 11, wherein said second polymer comprises: poly(methyl methacrylate) (PMMA); polyethylene oxide (PEO); poly[9,9-bis(6'(diethanolamino)hexyl)-fluorene] (PFO-OH) or its quaternized salt; or poly[9,9-bis(3'-(N,N-dimethylamino)propyl)-2,7-fluorene]-alt-2,7-(9,9-dioctylfluorene)] (PF-NR2) or its quaternized salts.

13. The photovoltaic cell of claim 1, wherein said ZnO nanoparticle layer comprises ZnO nanoparticles doped with metal atoms.

14. The photovoltaic cell of claim 13, wherein said metal atom dopants are Al, In, Sb, Mg, Gd, Ga, Cu or any combination thereof.

* * * * *